United States Patent
Miller et al.

(10) Patent No.: US 9,953,790 B1
(45) Date of Patent: Apr. 24, 2018

(54) ELECTRICAL SWITCHING APPARATUS AND SENSING ASSEMBLY THEREFOR

(71) Applicant: EATON CORPORATION, Cleveland, OH (US)

(72) Inventors: Theodore James Miller, Oakdale, PA (US); James I Wise, Cranberry Township, PA (US); Sunnybhai Patel, Chicago, IL (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 29 days.

(21) Appl. No.: 15/290,008

(22) Filed: Oct. 11, 2016

(51) Int. Cl.
  *H01H 83/20* (2006.01)
  *G01R 19/25* (2006.01)
  *H01H 71/02* (2006.01)

(52) U.S. Cl.
  CPC ......... *H01H 83/20* (2013.01); *G01R 19/2513* (2013.01); *H01H 71/02* (2013.01); *H01H 2300/052* (2013.01)

(58) Field of Classification Search
  CPC .................. H01H 83/20–83/22; H01H 83/226
  See application file for complete search history.

(56) References Cited

U.S. PATENT DOCUMENTS

2013/0329331 A1* 12/2013 Erger .................. H02H 1/0084
    361/102

FOREIGN PATENT DOCUMENTS

| DE | 202 20 326 U1 | 6/2003 |
| DE | 10 2014 117 807 A1 | 6/2015 |
| EP | 2 963 670 A1 | 1/2016 |

OTHER PUBLICATIONS

European Patent Office, "International Search Report and Written Opinion", PCT/US2017/052368, Feb. 20, 2017, 10 pp.

* cited by examiner

*Primary Examiner* — Ramon M Barrera
(74) *Attorney, Agent, or Firm* — Eckert Seamans (57) ABSTRACT

A sensing assembly is for an electrical switching apparatus. The electrical switching apparatus includes a base having a pocket portion, and a bus bar coupled to the base. The sensing assembly includes a housing structured to be coupled to the pocket portion, a power harvester coupled to the housing, a current sensor coupled to the housing, and a voltage sensing circuit located internal with respect to the housing and being structured to be electrically connected to the bus bar.

20 Claims, 7 Drawing Sheets

ELECTRICAL SWITCHING APPARATUS AND SENSING ASSEMBLY THEREFOR

BACKGROUND

Field

The disclosed concept relates generally to electrical switching apparatus such as, for example, circuit breakers. The disclosed concept also relates to sensing assemblies for circuit breakers.

Background Information

Electrical switching apparatus are used to protect electrical circuitry from damage due to a trip condition, such as, for example, an overcurrent condition, an overload condition, an under-voltage condition, a relatively high level short circuit or fault condition, a ground fault or arc fault condition. Molded case circuit breakers, for example, include at least one pair of separable contacts which are operated either manually by way of a handle located on the outside of the case, or automatically by way of a trip unit in response to the trip condition. Traditional circuit breakers also have components for current sensing, voltage sensing, and power harvesting. These components are housed in separate locations within the circuit breaker, which presents challenges in terms of wire management and also circuit breaker assembly time. Multiple components further results in the use of a relatively large volume of space inside the circuit breaker.

There is, therefore, room for improvement in electrical switching apparatus and in sensing assemblies therefor.

SUMMARY

These needs and others are met by embodiments of the disclosed concept, which are directed to a novel electrical switching apparatus and sensing assembly therefor.

As one aspect of the disclosed concept, a sensing assembly is provided for an electrical switching apparatus. The electrical switching apparatus includes a base having a pocket portion, and a bus bar coupled to the base. The sensing assembly includes a housing structured to be coupled to the pocket portion, a power harvester coupled to the housing, a current sensor coupled to the housing, and a voltage sensing circuit located internal with respect to the housing and being structured to be electrically connected to the bus bar.

As another aspect of the disclosed concept, an electrical switching apparatus including the aforementioned sensing assembly is provided.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the statement that two or more parts are "coupled" together shall mean that the parts are joined together either directly or joined through one or more intermediate parts.

As employed herein, the term "number" shall mean one or an integer greater than one (i.e., a plurality).

Figure 1:
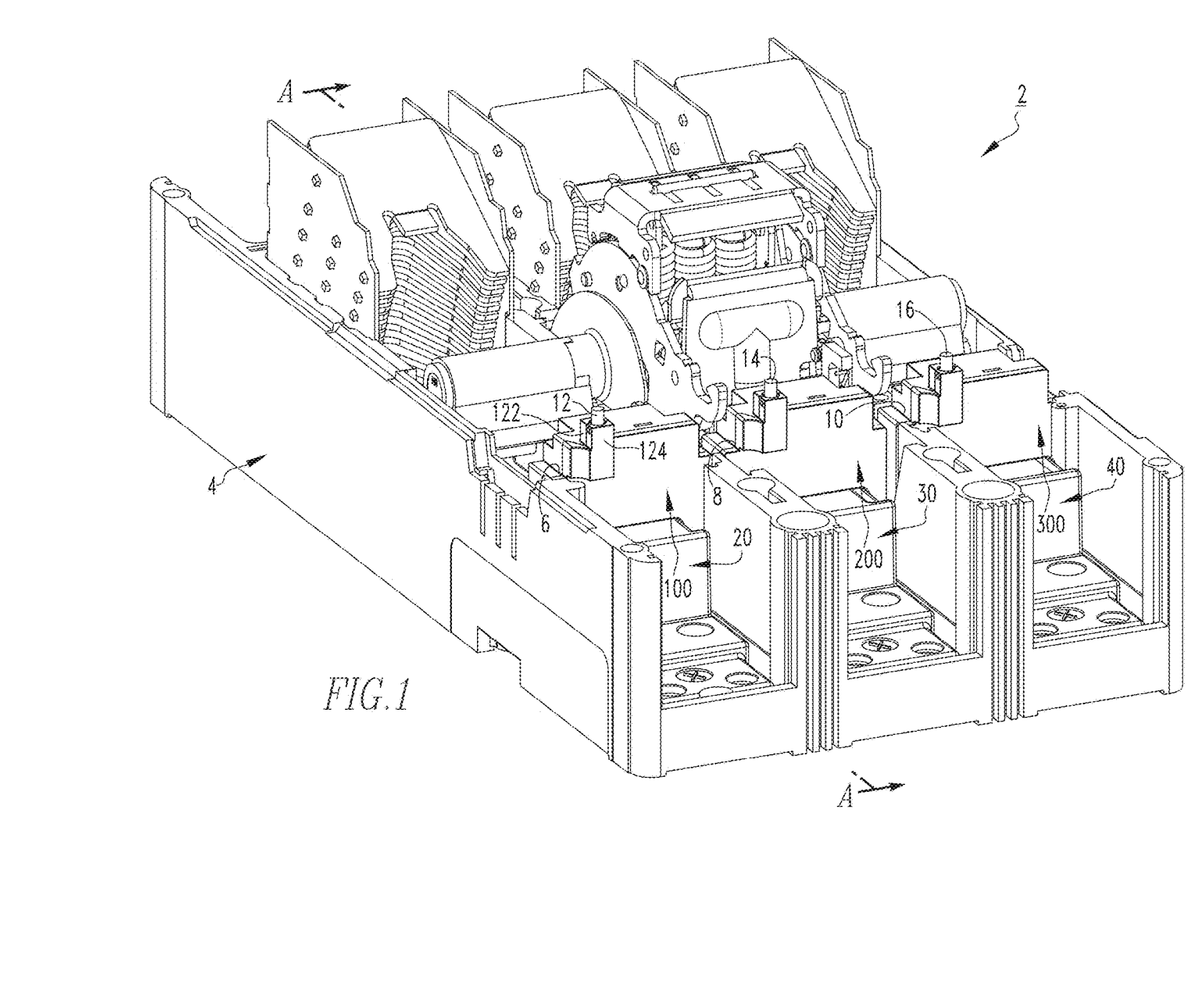
FIG. 1 is an isometric view of a portion of an electrical switching apparatus and sensing assembly therefor, in accordance with a non-limiting embodiment of the disclosed concept.
Figure 2:
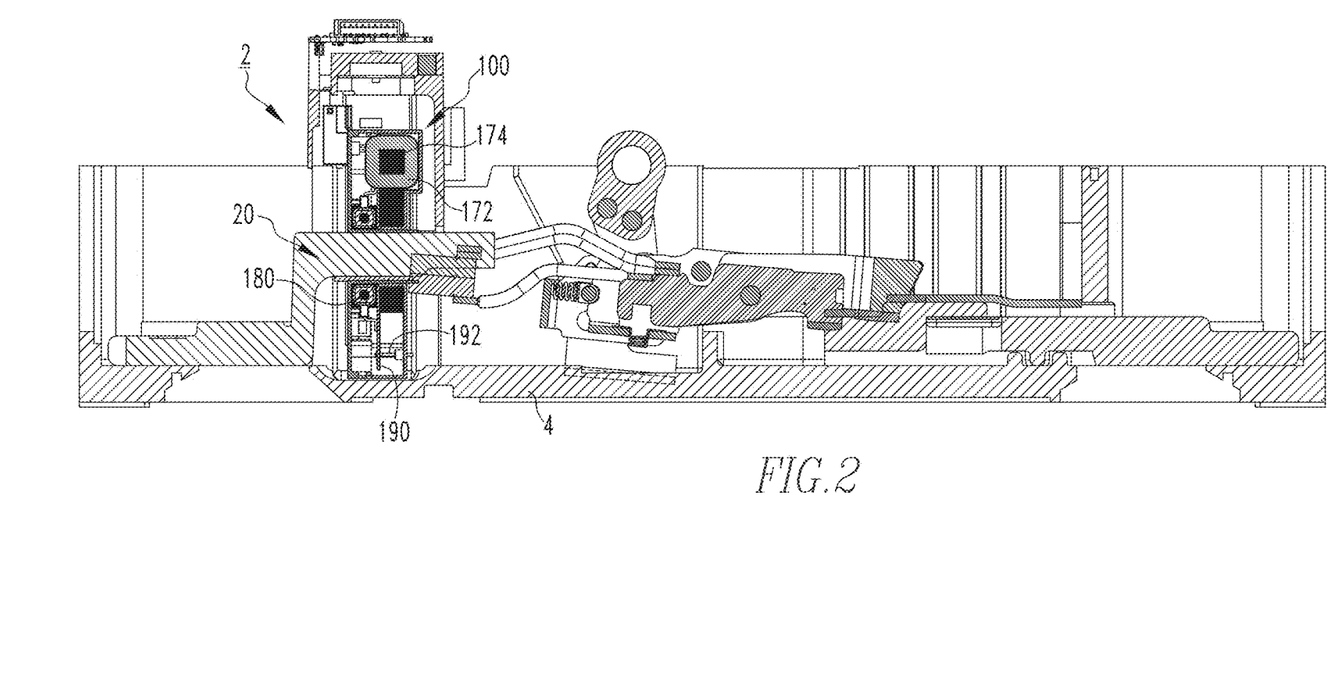
FIG. 2 is a section view of the electrical switching apparatus and sensing assembly therefor of FIG. 1, taken along line A-A of FIG. 1, and shown with portions removed for ease of illustration.

FIGS. 1 and 2 show a portion of an electrical switching apparatus (e.g., without limitation, three pole molded case circuit breaker 2), in accordance with a non-limiting embodiment of the disclosed concept. The example circuit breaker 2 includes an insulative base 4 having a number of pocket portions 6,8,10, a number of bus bars 20,30,40 each coupled to the base 4, and a corresponding number of novel sensing assemblies 100,200,300 each structured to be coupled to and located in one of the pocket portions 6,8,10. As will be discussed in greater detail below, the sensing assemblies 100,200,300 are each single units that include components for harvesting power, sensing current, and sensing voltage within the circuit breaker 2. Among other benefits, providing all three of these functionalities within a single unit saves space within the circuit breaker 2 and allows it to be more compact, as compared to prior art circuit breakers (not shown) in which components for harvesting power, sensing current, and sensing voltage are not all disposed in one single location. Furthermore, the sensing assemblies 100,200,300 are each advantageously structured to provide adequate spacing for creepage, and also provide strain relief to cables (see, for example, cables 12,14,16) of the circuit breaker 2 that exit the respective sensing assemblies 100,200,300.

Figure 3:
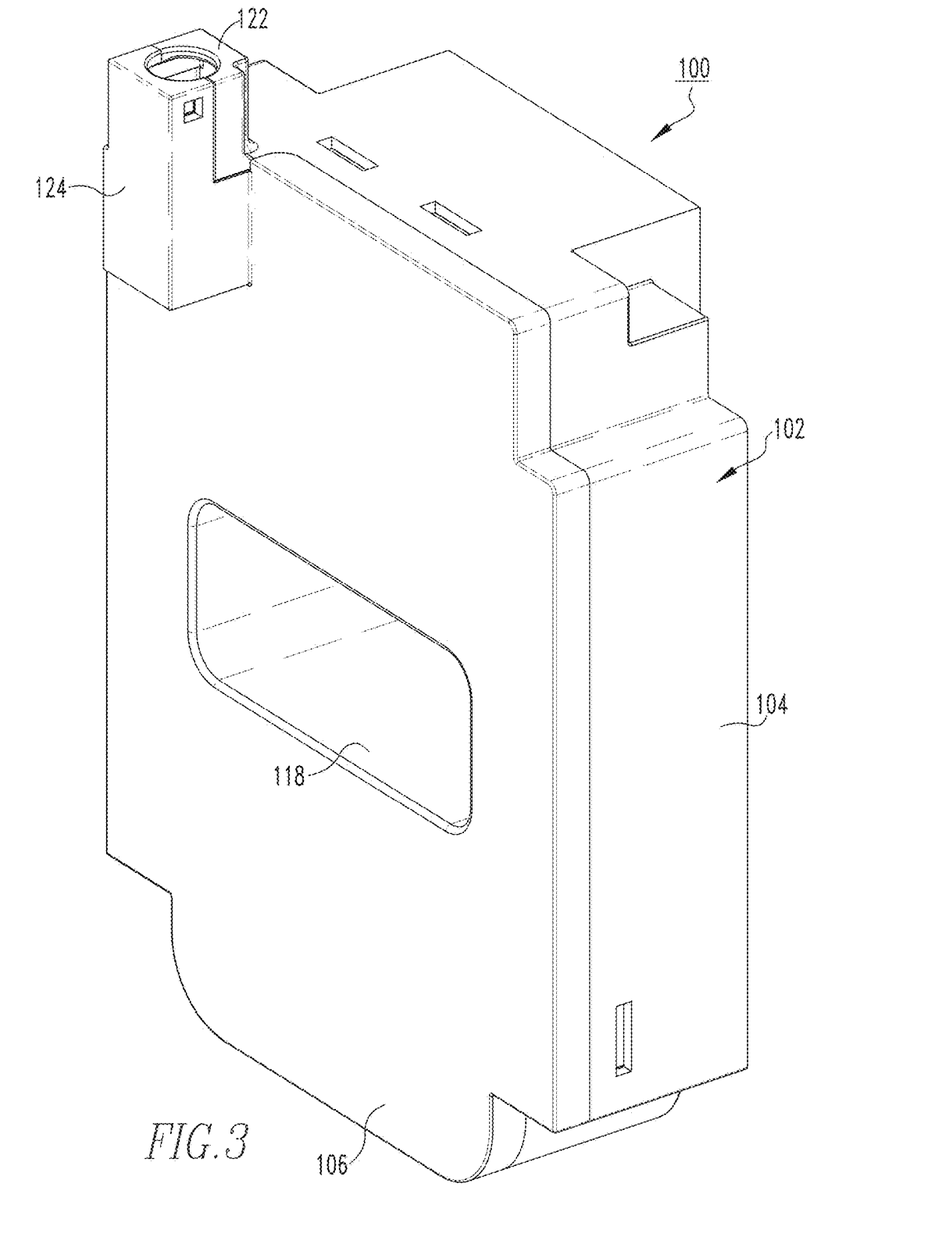
FIG. 3 is an isometric view of the sensing assembly of FIG. 2.

For economy of disclosure, only the sensing assembly 100 and the bus bar 20 will be described in detail, although it will be appreciated that the sensing assemblies 200,300 and the bus bars 30,40 in the example of FIG. 1 are preferably substantially the same and function substantially the same as the sensing assembly 100 and the bus bar 20. As seen in FIG. 3, the sensing assembly 100 includes a housing 102 that has a pair of housing members 104,106 coupled to each other. The housing 102 is coupled to and is reliably maintained in the pocket portion 6 (FIG. 1). It will further be appreciated that the sensing assembly 100 of the disclosed concept could be employed in any suitable number in conjunction with electrical switching apparatus other than the three pole circuit breaker 2 shown and described herein.

Figure 4:
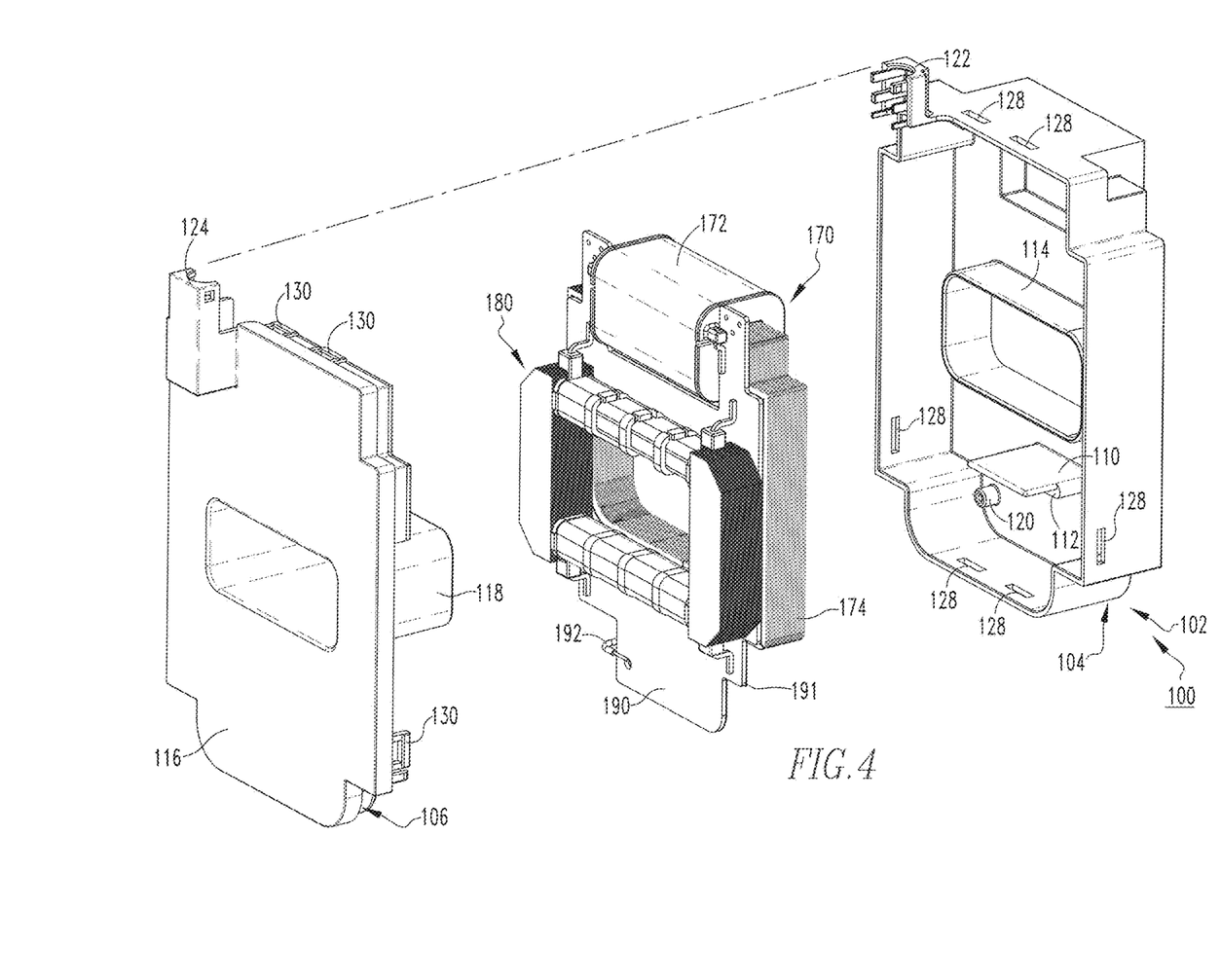
FIG. 4 is an exploded isometric view of the sensing assembly of FIG. 3.
Figure 5:
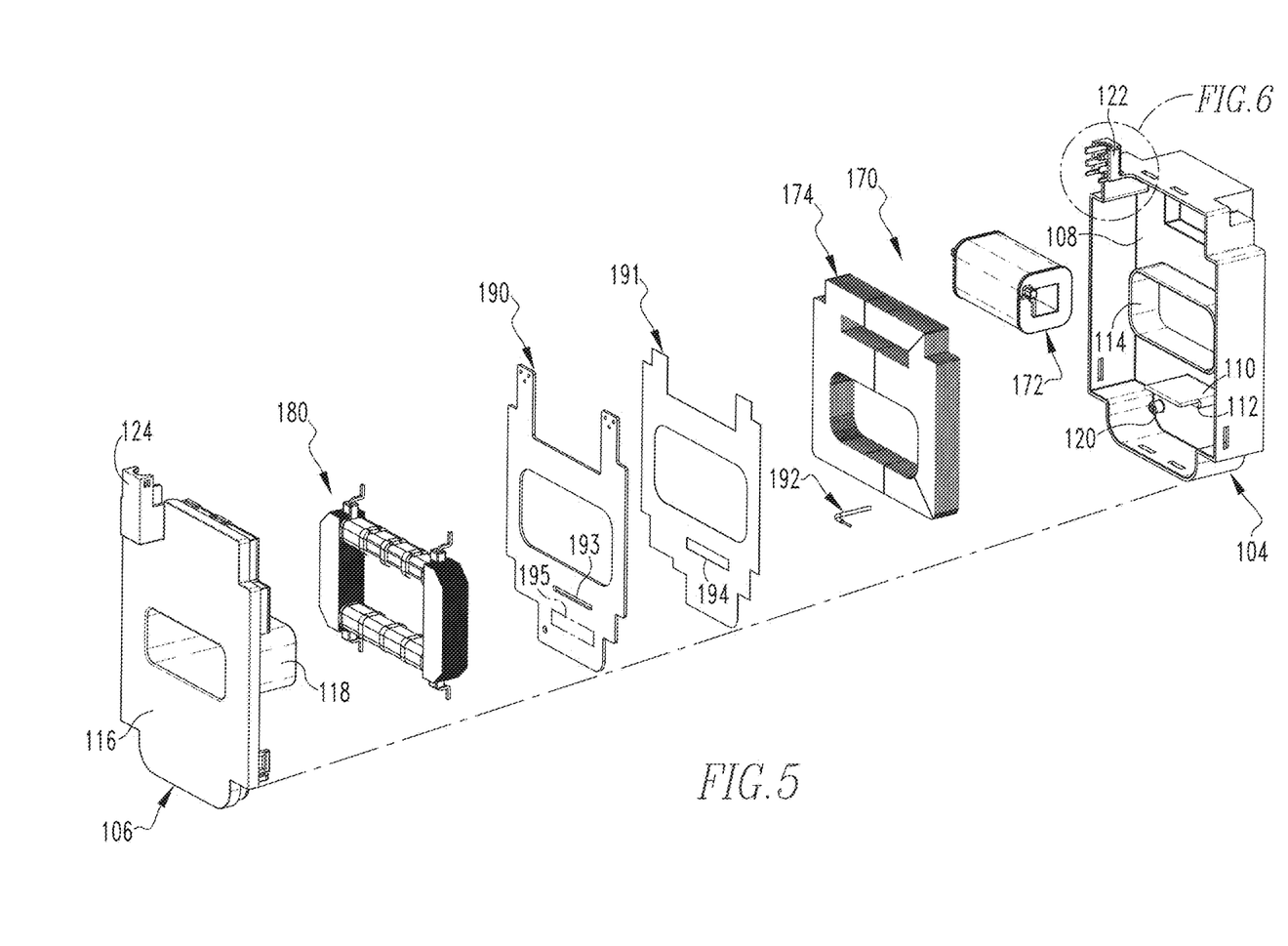
FIG. 5 is another exploded isometric view of the sensing assembly of FIG. 3.

As seen in FIGS. 4 and 5, the sensing assembly 100 further includes a power harvester 170, a current sensor 180, a printed circuit board 190, and a barrier member 191 each coupled to the housing 102. The power harvester 170 includes a harvester bobbin 172 and a plurality of power harvester laminations 174 coupled to the harvester bobbin 172. The power harvester laminations 174, the printed circuit board 190, and the barrier member 191 are all preferably parallel to one another in order to be ergonomically maintained within the housing 102. The barrier member 191 is made of an insulative material such as, for example, fish paper (also known as vulcanized fiber or vulcanized cotton based fiber), and functions to separate the printed circuit board 190 from the power harvester laminations 174. The printed circuit board 190 has a voltage sensing circuit that is located internal with respect to the housing 102, and is electrically connected to the bus bar 20 by, for example and without limitation, an electrical wire (e.g., electrical wire 192). Although the disclosed concept is being described in association with the electrical wire 192 providing the electrical connection between the voltage sensing circuit and the bus bar 20, it will be appreciated that any suitable alternative connection (e.g., without limitation, a spring loaded tab (not shown)) may be employed in order to perform the desired function of electrically connecting the bus bar 20 to the voltage sensing circuit. Furthermore, the voltage sensing circuit functions to sense voltage within the circuit breaker 2 (FIGS. 1 and 2), as will be discussed below.

Continuing to refer to FIGS. 4 and 5, the first housing member 104 has a body portion 108, an elongated extension portion 110 extending outwardly from the body portion 108, and a number of annular-shaped protrusions 114,120 extending outwardly from the body portion 108. The extension portion 110 in part functions to stabilize the sensing/power harvesting components 170,180,190 within the sensing assembly 100. More specifically, the printed circuit board 190 and the barrier member 191 each have respective slots 193,194 (see FIG. 5) and the extension portion 110 extends through the slots 193,194 in order to maintain the printed circuit board 190 on the first housing member 104. Furthermore, the extension portion 110 provides a mechanism to maintain the printed circuit board 190 at a predetermined depth within the first housing member 104. More precisely, as seen, the extension portion 110 has a shelf portion 112 structured to engage the barrier member 191 and be located on a side of the printed circuit board 190. The extension portion 110 also advantageously functions as an insulative barrier between a portion of the voltage sensing circuit (see, for example, portion 195 of the printed circuit board 190, indicated in FIG. 5, and corresponding to a plurality of resistors of the voltage sensing circuit) and the harvester bobbin 172.

The housing 102 also provides adequate spacing for creepage distance (i.e., the shortest distance along a solid insulative material or materials between two conductive parts) between the bus bar 20 and the internal electrical components of the sensing assembly 100 (i.e., power harvester 170, current sensor 180, and printed circuit board 190). The second housing member 106 includes a body portion 116 and an annular-shaped protrusion 118 extending outwardly from the body portion 116. When the housing members 104,106 are coupled together, the protrusions 114,118 are concentric with respect to each other. Furthermore, the power harvester laminations 174, the current sensor 180, and the printed circuit board 190 are concentric with respect to the protrusions 114,118. Additionally, when the sensing assembly 100 is installed in the circuit breaker 2, the bus bar 20 extends through the thru holes defined by the protrusions 114,118. Thus, by having the protrusions 114,118, undesirable electrical arcing between the bus bar 20 and the internal electrical components (i.e., power harvester 170, current sensor 180, and printed circuit board 190) of the sensing assembly 100 is significantly reduced, as current would be forced to wind around the protrusions 114,118 in order to reach the internal electrical components 170,180, 190 of the sensing assembly 100. The protrusions 114,118 also function in part to stabilize the internal electrical components 170,180,190 of the sensing assembly 100 within the housing 102.

As mentioned above, the printed circuit board 190 has a voltage sensing circuit that senses voltage within the circuit breaker 2 (FIGS. 1 and 2). Specifically, the sensing assembly 100 further includes a voltage tap (e.g., without limitation, electrical wire 192) electrically connected to the printed circuit board 190 at a first end and electrically connected to the bus bar 20 at a second end. Thus, the electrical wire 192 carries the voltage from the bus bar 20 to the voltage sensing circuit of the printed circuit board 190, which in turn steps down the voltage and communicates it to the cable 12 (FIG. 1). In other words, the voltage sensing circuit of the printed circuit board 190 in part provides an electrical pathway between the electrical wire 192 and the cable 12. Accordingly, the electrical components (i.e., power harvester 170, current sensor 180, and printed circuit board 190 including the voltage sensing circuit) of the sensing assembly 100 are structured so as to collectively cooperate or join together to form a self-contained subassembly within the circuit breaker 2 (FIGS. 1 and 2) that is advantageously able to perform the three separate functions of harvesting power, sensing current, and sensing voltage. This is distinct from prior art circuit breakers (not shown) in which similar subassemblies only function to harvest power and sense current. That is, unlike prior art circuit breakers (not shown) that have voltage sensing capabilities separate and apart from current sensing/power harvesting capabilities, the sensing assembly 100 of the circuit breaker 2 (FIGS. 1 and 2) is advantageously able to perform the additional function of sensing voltage within the circuit breaker 2 (FIGS. 1 and 2). As a result, the novel sensing assembly 100 saves space, simplifies assembly, and more efficiently manages electrical wire arrangements in the circuit breaker 2 (FIGS. 1 and 2).

Figure 7:
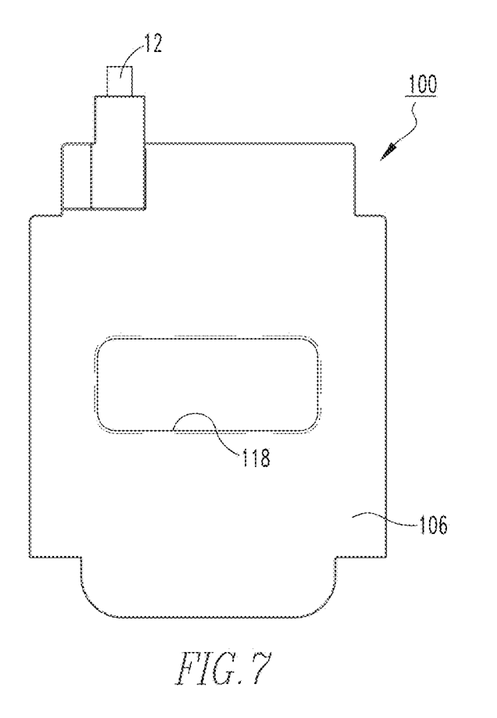
FIG. 7 is a front elevation view of the sensing assembly of FIG. 3, and shown with a portion of a cable of the electrical switching apparatus.
Figure 8:
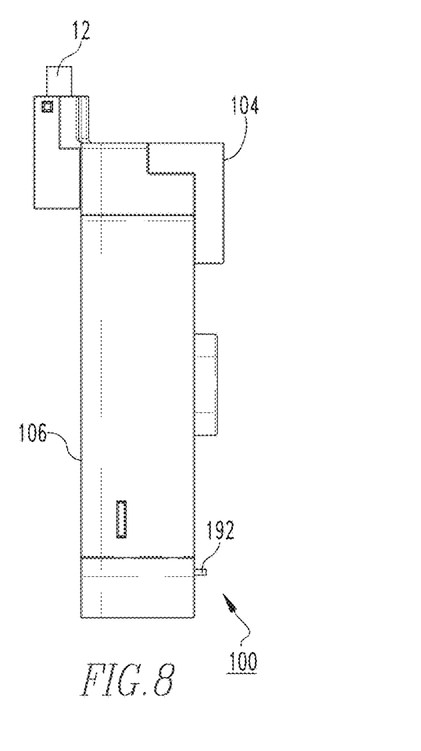
FIG. 8 is a right side elevation view of the sensing assembly of FIG. 7.
Figure 9:
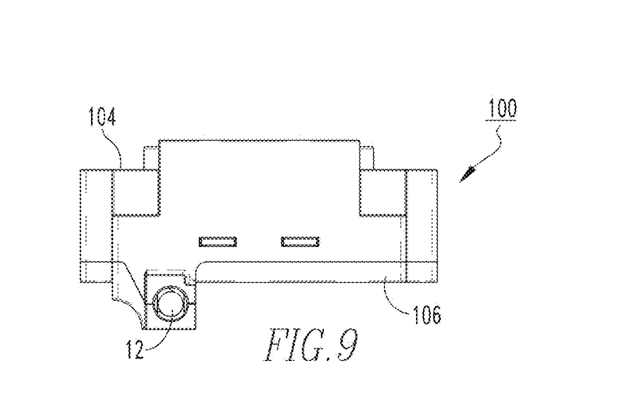
FIG. 9 is a top elevation view of the sensing assembly of FIG. 8.

Additionally, the housing 102 provides a mechanism to protect the electrical wire 192 and the cables 12,14,16 (FIG. 1). Specifically, the electrical wire 192 extends through a thru hole of the protrusion 120 and a coinciding thru hole of the body portion 108. The protrusion 120 functions to straighten the electrical wire 192 before it exits the sensing assembly 100, thus minimizing the effects of the electrical wire 192 cutting into the first member 104 as it passes through and/or bends around the first housing member 104 upon exiting. FIGS. 7, 8, and 9 show additional views of the sensing assembly 100. As seen in FIG. 8, the electrical wire 192 is generally straight as it exits the sensing assembly 100.

Figure 6:
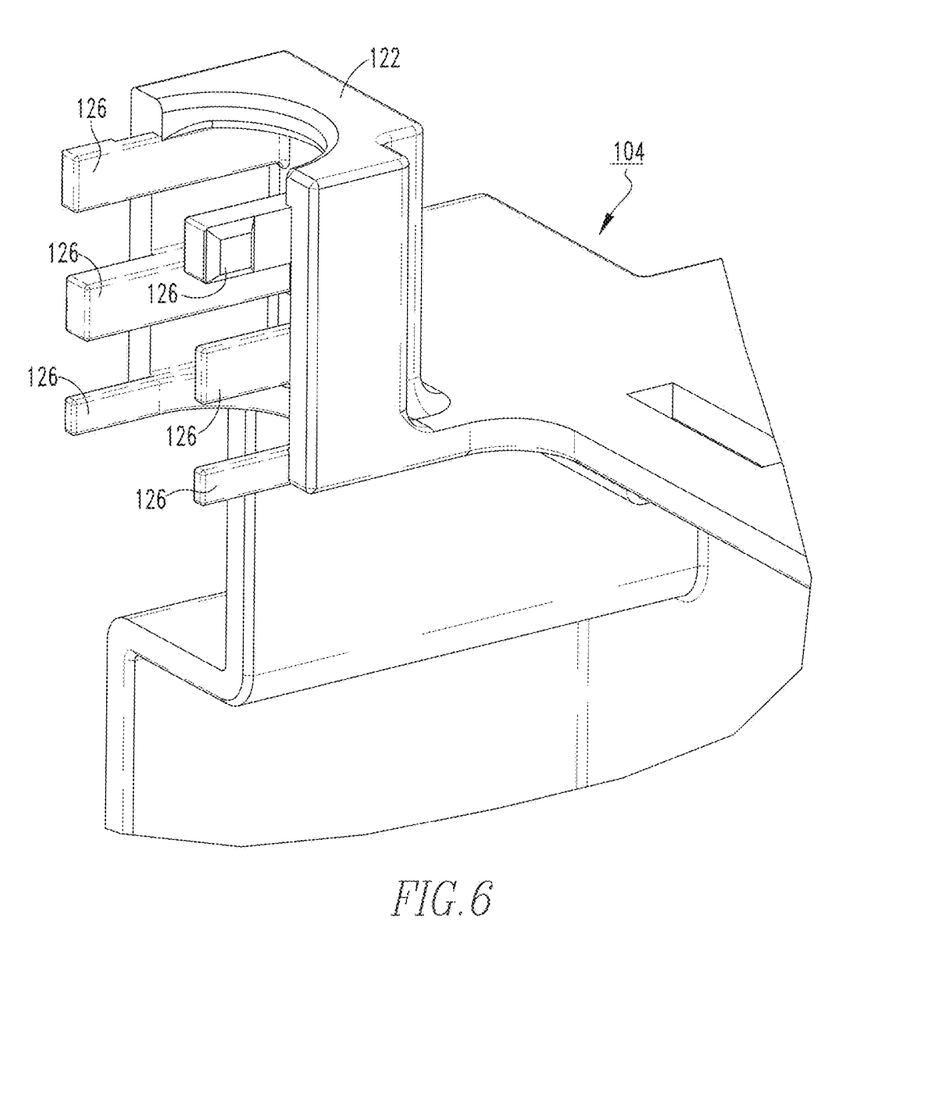
FIG. 6 is an enlarged view of a portion of the sensing assembly of FIG. 5.

Regarding the cables 12,14,16 (FIG. 1), for economy of disclosure only the cable 12 will be described in association with the sensing assembly 100, although it will be appreciated that the cables 14,16 and the corresponding sensing assemblies 200,300 in the example of FIG. 1 function substantially the same as the cable 12 and the sensing assembly 100. Referring to FIG. 6, the first housing member 104 includes a receiving portion 122 having a plurality of projections 126. The second housing member 106 has a receiving portion 124 (see, for example, FIG. 5), and although not shown, it will be appreciated that the receiving portion 124 has a plurality of slots. Each of the projections 126 extends into a corresponding one of the slots of the receiving portion 124 in order to couple the receiving portions 122,124 together. Furthermore, the cable 12 is structured to be coupled to the receiving portions 122,124 by a press fit mechanism in order to provide desirable strain relief to the cable 12, which is mechanically coupled and electrically connected to the printed circuit board 190.

Finally, the first housing member 104 is coupled to the second housing member 106 by a snap-fit mechanism. More specifically, the first housing member 104 has a plurality of slots 128 and the second housing member 106 has a plurality of deflection members 130 each extending into a corresponding one of the slots 128. In this manner, the power harvester 170, the current sensor 180, the printed circuit board 190, and the barrier member 191 are each reliably maintained within and located internal with respect to the housing 102.

Accordingly, it will be appreciated that the disclosed concept provides for an improved (e.g., without limitation, more efficiently constructed, easier to assemble) electrical switching apparatus 2 and sensing assembly 100,200,300 therefor, in which a voltage sensing circuit is provided within the sensing assemblies 100,200,300. As a result, among other benefits, the single compact sensing assemblies 100,200,300 are able to sense voltage, in addition to harvesting power and sensing current.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A sensing assembly for an electrical switching apparatus, said electrical switching apparatus comprising a base having a pocket portion, and a bus bar coupled to said base, said sensing assembly comprising:
   a housing structured to be coupled to said pocket portion;
   a power harvester coupled to said housing;
   a current sensor coupled to said housing; and
   a voltage sensing circuit disposed internal with respect to said housing and being structured to be electrically connected to said bus bar.

2. The sensing assembly of claim 1 wherein said sensing assembly further comprises a printed circuit board mechanically coupled and electrically connected to said power harvester and said current sensor; and wherein said printed circuit board comprises said voltage sensing circuit.

3. The sensing assembly of claim 2 wherein said power harvester, said current sensor, and said printed circuit board are disposed internal with respect to said housing.

4. The sensing assembly of claim 2 wherein said housing comprises a first housing member and a second housing member coupled to said first housing member; wherein said first housing member comprises a body portion and an elongated extension portion extending outwardly from said body portion; wherein said printed circuit board has an elongated slot; and wherein said extension portion extends through the slot in order to maintain said printed circuit board on said first housing member.

5. The sensing assembly of claim 4 wherein said extension portion has a shelf portion disposed on a side of said printed circuit board in order to maintain said printed circuit board at a predetermined depth within said first housing member.

6. The sensing assembly of claim 2 wherein said housing comprises a first housing member and a second housing member coupled to said first housing member; wherein said first housing member comprises a body portion and an annular-shaped protrusion extending outwardly from said body portion; wherein said second housing member comprises a body portion and an annular-shaped protrusion extending outwardly from said body portion of said second housing member; and wherein said protrusion of said first housing member and said protrusion of said second housing member are disposed concentric with respect to each other.

7. The sensing assembly of claim 6 wherein said power harvester comprises a harvester bobbin and a plurality of power harvester laminations coupled to said harvester bobbin; and wherein said printed circuit board, said current sensor, and said power harvester laminations are concentric with respect to said protrusion of said first housing member and said protrusion of said second housing member.

8. The sensing assembly of claim 2 wherein said sensing assembly further comprises an electrical wire electrically connecting said bus bar to said voltage sensing circuit.

9. The sensing assembly of claim 8 wherein said housing comprises a first housing member and a second housing member coupled to said first housing member; wherein said first housing member comprises a body portion and a protrusion extending outwardly from said body portion; wherein said protrusion has a thru hole; wherein said body portion has a thru hole coinciding with the thru hole of said protrusion; and wherein said electrical wire extends though the thru hole of said body portion and the thru hole of said protrusion.

10. The sensing assembly of claim 2 wherein said electrical switching apparatus further comprises a cable structured to be mechanically coupled and electrically connected to said printed circuit board; wherein said housing comprises a first housing member and a second housing member coupled to said first housing member; wherein said first housing member has a first receiving portion; wherein said second housing member has a second receiving portion coupled to said first receiving portion; and wherein said first receiving portion and said second receiving portion are structured to be coupled to said cable by a press fit mechanism.

11. The sensing assembly of claim 10 wherein said second receiving portion has a plurality of slots; and wherein said first receiving portion comprises a plurality of projections each extending into a corresponding one of the plurality of slots.

12. The sensing assembly of claim 2 wherein said power harvester comprises a harvester bobbin and a plurality of power harvester laminations coupled to said harvester bobbin; and wherein said sensing assembly further comprises a barrier member separating said printed circuit board from said power harvester laminations.

13. The sensing assembly of claim 12 wherein said barrier member, said printed circuit board, and said power harvester laminations are all parallel to one another.

14. The sensing assembly of claim 12 wherein said barrier member is made of fish paper.

15. The sensing assembly of claim 1 wherein said housing comprises a first housing member and a second housing member coupled to said first housing member; wherein said first housing member has a plurality of slots; wherein said second housing member has a plurality of deflection members; and wherein each of said plurality of deflection members is disposed in a corresponding one of said plurality of slots in order to couple said second housing member to said first housing member.

16. An electrical switching apparatus comprising:
a base having at least one pocket portion;
at least one bus bar coupled to said base; and
at least one sensing assembly comprising:
- a housing coupled to said at least one pocket portion,
- a power harvester coupled to said housing,
- a current sensor coupled to said housing, and
- a voltage sensing circuit disposed internal with respect to said housing and being electrically connected to said at least one bus bar.

17. The electrical switching apparatus of claim 16 wherein said at least one sensing assembly further comprises a printed circuit board mechanically coupled and electrically connected to said power harvester and said current sensor; and wherein said printed circuit board comprises said voltage sensing circuit.

18. The electrical switching apparatus of claim 17 wherein said at least one sensing assembly further comprises an electrical wire electrically connecting said at least one bus bar to said voltage sensing circuit.

19. The electrical switching apparatus of claim 17 wherein said electrical switching apparatus further comprises a cable mechanically coupled and electrically connected to said printed circuit board; wherein said housing comprises a first housing member and a second housing member coupled to said first housing member; wherein said first housing member has a first receiving portion; wherein said second housing member has a second receiving portion coupled to said first receiving portion; and wherein said first receiving portion and said second receiving portion are coupled to said cable by a press fit mechanism.

20. The electrical switching apparatus of claim 13 wherein said at least one pocket portion is a plurality of pocket portions; wherein said at least one bus bar is a plurality of bus bars; wherein said electrical switching apparatus is a molded case circuit breaker having a plurality of poles; and wherein said at least one sensing assembly is a plurality of sensing assemblies each for a corresponding one of said plurality of poles.

* * * * *